(12) United States Patent
Odaka

(10) Patent No.: US 10,446,637 B2
(45) Date of Patent: Oct. 15, 2019

(54) DISPLAY DEVICE AND METHOD OF MANUFACTURING A DISPLAY DEVICE

(71) Applicant: Japan Display Inc., Minato-ku (JP)

(72) Inventor: Kazuhiro Odaka, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/986,950

(22) Filed: May 23, 2018

(65) Prior Publication Data
US 2018/0350893 A1 Dec. 6, 2018

(30) Foreign Application Priority Data
Jun. 2, 2017 (JP) .................. 2017-109994

(51) Int. Cl.
| H01L 27/32 | (2006.01) |
| H01L 23/00 | (2006.01) |
| H01L 25/18 | (2006.01) |
| H01L 51/52 | (2006.01) |

(52) U.S. Cl.
CPC .......... *H01L 27/3276* (2013.01); *H01L 24/32* (2013.01); *H01L 24/83* (2013.01); *H01L 25/18* (2013.01); *H01L 51/5253* (2013.01); *H01L 2224/29016* (2013.01); *H01L 2224/2919* (2013.01); *H01L 2224/32145* (2013.01); *H01L 2224/83203* (2013.01); *H01L 2224/83862* (2013.01); *H01L 2251/5338* (2013.01); *H01L 2924/0635* (2013.01); *H01L 2924/1426* (2013.01); *H01L 2924/2064* (2013.01)

(58) Field of Classification Search
CPC ..... H01L 24/32; H01L 24/83; H01L 51/0097; H01L 51/5253; H01L 2224/29016; H01L 2224/2919; H01L 2224/32135; H01L 2224/32145; H01L 2251/5338
See application file for complete search history.

(56) References Cited

U.S. PATENT DOCUMENTS

2011/0037059 A1* 2/2011 Gyoda ............... H01L 27/3276
257/40
2011/0223697 A1 9/2011 Yong-Hwan et al.
(Continued)

FOREIGN PATENT DOCUMENTS

JP  2011-187446  9/2011

*Primary Examiner* — David C Spalla
(74) *Attorney, Agent, or Firm* — Oblon, McClelland, Maier & Neustadt, L.L.P.

(57) ABSTRACT

A method of manufacturing a display device according to an embodiment of the present invention includes: placing a component via an adhesive material on one side of a base material containing a resin and having display area; stacking a protective film via a pressure-sensitive adhesive layer on the other side of the base material; and mounting the component on the base material by sandwiching and pressurizing the base material and the component using a pair of heads. An exposed portion in which no protective film is stacked is formed on the other side of the base material and is provided in correspondence with an area in which the component is provided, and one of the pair of heads has a contact portion, and the contact portion is housed within the exposed portion of the base material and the contact portion is brought into direct contact with the base material.

10 Claims, 5 Drawing Sheets

(56) References Cited

U.S. PATENT DOCUMENTS

| | | | |
|---|---|---|---|
| 2014/0092338 A1* | 4/2014 | Miyazaki | G02F 1/13452 349/58 |
| 2015/0137098 A1* | 5/2015 | Tanaka | H01L 27/3276 257/40 |
| 2019/0036075 A1* | 1/2019 | Jiang | H01L 51/5253 |

* cited by examiner

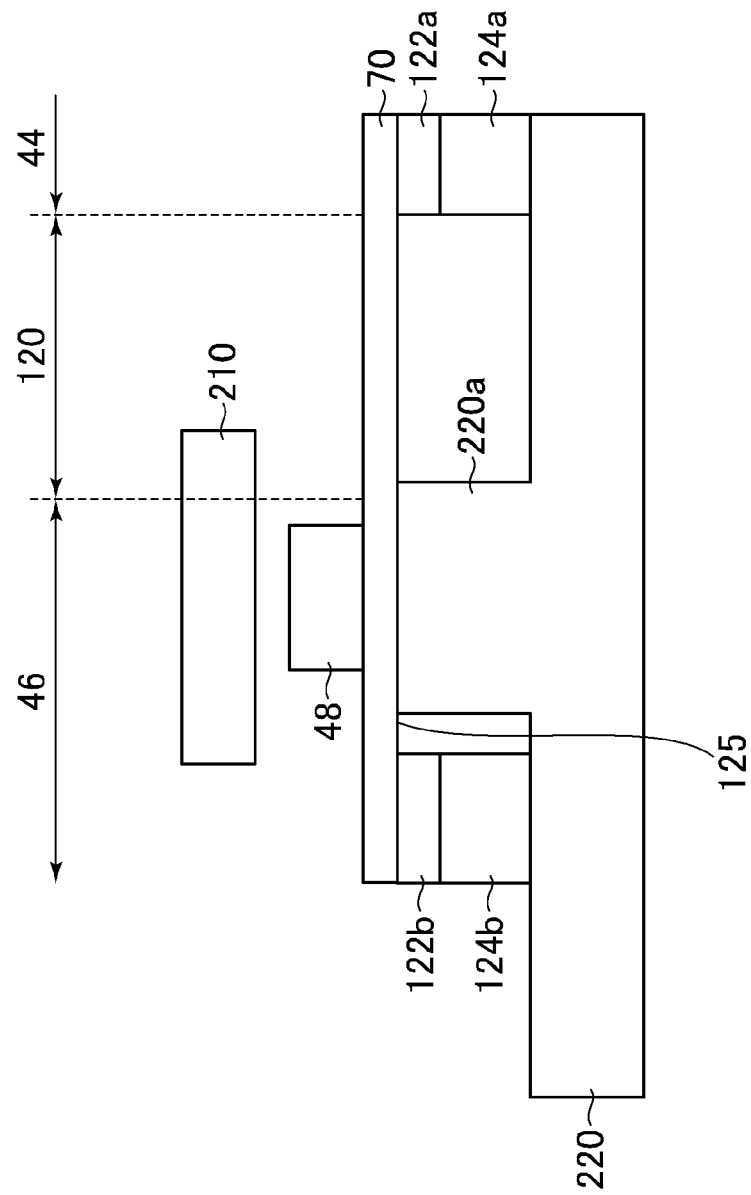

DISPLAY DEVICE AND METHOD OF MANUFACTURING A DISPLAY DEVICE

CROSS-REFERENCE TO RELATED APPLICATION

The present application claims priority from Japanese Application JP2017-109994 filed on Jun. 2, 2017, the content of which is hereby incorporated by reference into this application.

BACKGROUND OF THE INVENTION

1. Field of the Invention

One or more embodiments of the present invention relate to a display device and a method of manufacturing a display device.

2. Description of the Related Art

In a display device including a display area such as an organic electroluminescence (EL) display device and a liquid crystal display device, recently, development of a flexible display having a bendable display panel using a base material having flexibility has been advanced.

For example, as disclosed in JP 2011-187446 A, the base material having flexibility is supported by a support substrate (e.g. glass substrate) in the manufacturing process of the display panel in view of handling ability or the like, and separated from the support substrate at any suitable time.

SUMMARY OF THE INVENTION

For example, in view of mass productivity, mounting of components (e.g. a driver IC (Integrated Circuit) forming the drive unit of the display device and a flexible printed board (FPC)) on the base material may be performed after separation of the support substrate. However, there is a problem that a mounting failure of the components is easily caused in the base material not supported by the support substrate (particularly, in the case of mounting of the driver IC requiring higher load for mounting).

One or more embodiments of the present invention have been made in view of the above, and an object thereof is to provide a display device with a suppressed mounting failure of components and a method of manufacturing the display device.

According to one aspect of the present invention, a method of manufacturing a display device is provided. The method of manufacturing a display device includes: placing a component via an adhesive material on one side of a base material containing a resin; stacking a protective film via a pressure-sensitive adhesive layer on the other side of the base material; and mounting the component on the base material by sandwiching and pressurizing the base material and the component using a pair of heads. A display area including a plurality of pixels is formed on the one side of the base material, an exposed portion in which no protective film is stacked is formed on the other side of the base material and is provided in correspondence with at least an area in which the component is provided on the one side of the base material, and one of the pair of heads has a contact portion, and, at the mounting, the contact portion is housed within the exposed portion of the base material and the contact portion is brought into direct contact with the base material.

According to another aspect of the present invention, a display device is provided. The display device includes: a base material containing a resin and having a display area including a plurality of pixels and a component mounting area; a component provided in the component mounting area of the base material via an adhesive material; and a protective film stacked via a pressure-sensitive adhesive layer on an opposite side to a side of the base material on which the component is provided. An exposed portion in which no protective film is stacked is formed on the opposite side to the side of the base material on which the component is provided and is provided in correspondence with at least an area in which the component is provided.

BRIEF DESCRIPTION OF THE DRAWINGS

FIG. 5 is a diagram for explanation of a method of manufacturing an organic EL display device in one embodiment of the invention.

DETAILED DESCRIPTION OF THE INVENTION

As below, embodiments of the invention will be explained with reference to the drawings. Note that disclosures are only examples, and the matter readily conceived with respect to appropriate changes by a person skilled in the art while keeping the spirit of the invention may naturally fall within the scope of the invention. Further, for clearer explanation, the drawings may be schematically described regarding widths, thicknesses, shapes, etc. of the respective parts compared to the actual forms, however, these are only examples and do not limit the interpretation of the invention. In the specification and the respective drawings, the same elements as those described in relation to the previously mentioned drawings may have the same signs and the detailed explanation may be omitted as appropriate.

Figure 1:
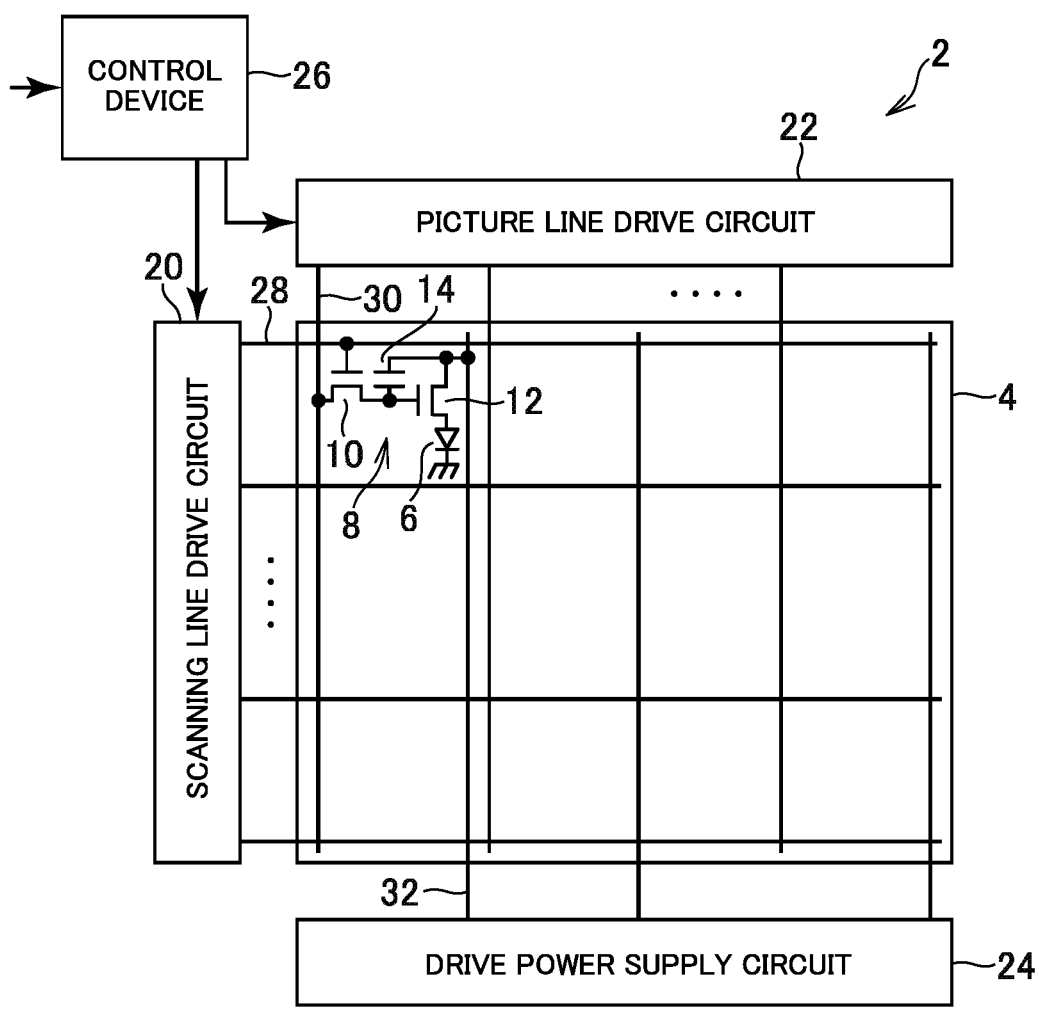
FIG. 1 is a schematic diagram showing a schematic configuration of an organic EL display device according to one embodiment of the invention.

FIG. 1 is a schematic diagram showing a schematic configuration of a display device according to one embodiment of the invention using an organic EL display device as an example. An organic EL display device 2 includes a pixel array unit 4 that displays an image and a drive unit that drives the pixel array unit 4. The organic EL display device 2 is a flexible display using a resin film as a base material and a stacking structure such as thin-film transistors (TFTs) and organic light emitting diodes (OLEDs) are formed on the base material formed by the resin film. Note that the schematic diagram shown in FIG. 1 is only an example and the embodiment is not limited to that.

In the pixel array unit 4, OLEDs 6 and pixel circuits 8 are arranged in a matrix form in correspondence with the pixels. The pixel circuit 8 includes a plurality of TFTs 10, 12 and a capacitor 14.

The drive unit includes a scanning line drive circuit 20, a picture line drive circuit 22, a drive power supply circuit 24, and a control device 26, and drives the pixel circuit 8 and controls light emission of the OLED 6.

The scanning line drive circuit 20 is connected to scanning signal lines 28 each provided for the respective horizontal lines of the pixels (pixel rows). The scanning line drive circuit 20 sequentially selects the scanning signal line 28 according to a timing signal input from the control device 26, and applies a voltage for turning on the lighting TFT 10 to the selected scanning signal line 28.

The picture line drive circuit 22 is connected to picture signal lines 30 each provided for the respective vertical lines of the pixels (pixel columns). A picture signals is input from the control device 26 to the picture line drive circuit 22, and the circuit outputs voltage according to the picture signal of the selected pixel row to the picture signal line 30 in response to the selection of the scanning signal line 28 by the scanning line drive circuit 20. The voltage is written in the capacitor 14 via the lighting TFT 10 in the selected pixel row. The drive TFT 12 supplies a current according to the written voltage to the OLED 6, and thereby, the OLED 6 of the pixel corresponding to the selected scanning signal line 28 emits light.

The drive power supply circuit 24 is connected to drive power supply lines 32 each provided for the respective pixel columns, and supplies a current to the OLED 6 via the drive power supply line 32 and the drive TFT 12 of the selected pixel row.

Here, the lower electrode of the OLED 6 is connected to the drive TFT 12. On the other hand, the upper electrodes of the respective OLEDs 6 are formed by an electrode in common with the OLEDs 6 of all pixels. When the lower electrode is formed as an anode, a higher potential is input thereto, and the upper electrode serves as a cathode and a lower potential is input thereto. When the lower electrode is formed as a cathode, a lower potential is input thereto, and the upper electrode serves as an anode and a higher potential is input thereto.

Figure 2:
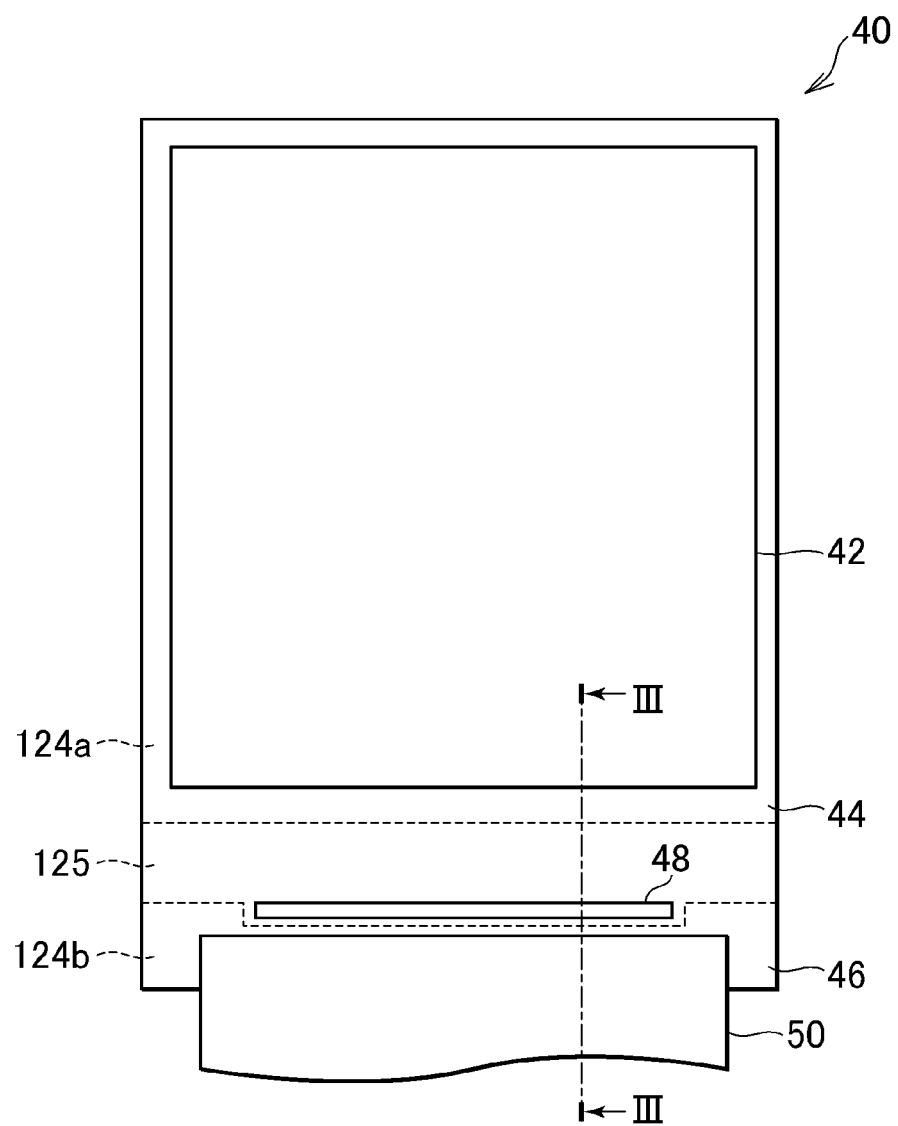
FIG. 2 is a schematic plan view showing an example of a display panel of the organic EL display device shown in FIG. 1.

FIG. 2 is a schematic plan view showing an example of a display panel of the organic EL display device shown in FIG. 1. In a display area 42 of a display panel 40, the pixel array unit 4 shown in FIG. 1 is provided and the OLEDs 6 are arranged in the pixel array unit 4 as described above. As described above, the upper electrode forming the OLEDs 6 is formed in common with the respective pixels and covers the whole display area 42.

A component mounting area 46 is provided in one side of the display panel 40 having a rectangular shape, and a wire connected to the display area 42 is placed therein. A driver IC 48 forming the drive unit is mounted on and the FPC 50 is connected to the component mounting area 46. The FPC 50 is connected to the control device 26 and the other circuits 20, 22, 24, etc., and an IC is mounted thereon.

Figure 3:
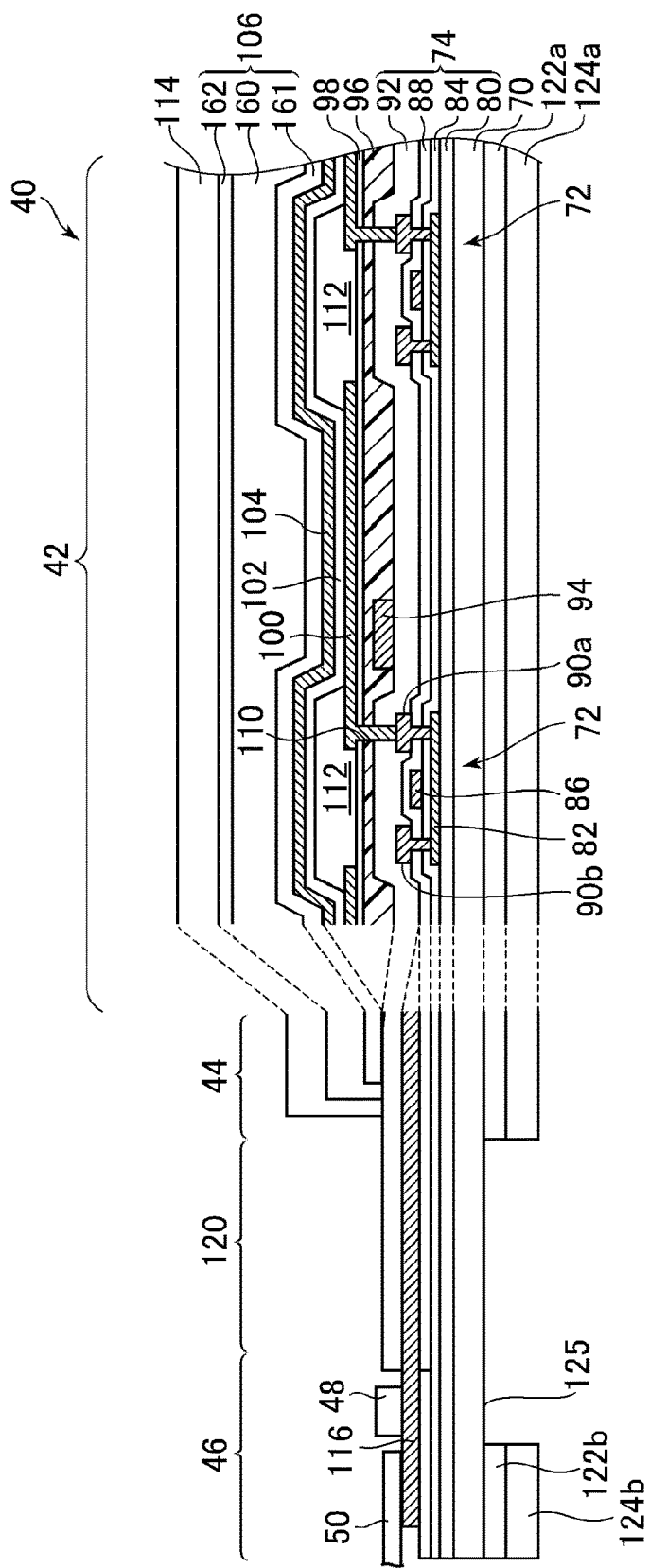
FIG. 3 shows an example of a section along III-III in FIG. 2.

FIG. 3 shows an example of a section along III-III in FIG. 2. The display panel 40 has a structure in which a circuit layer 74 with a TFT 72 etc. formed thereon, the OLED 6, and a sealing layer 106 sealing the OLED 6 are stacked on a base material 70 formed by a resin film. As the resin forming the base material 70, e.g. a polyimide-based resin is used. The thickness of the base material 70 is e.g. about 20 μm. A front protective film 114 is stacked on the sealing layer 106 and a back protective film 124 is stacked on the back side of the base material 70 (on the opposite side to the side on which the front protective film 114 is stacked).

In the embodiment, the pixel array unit 4 is of a top emission type and the light generated in the OLED 6 is output to the opposite side (upward in FIG. 3) to the base material 70. Note that, in the case where a color filter system is used as the coloring system in the organic EL display device 2, for example, a color filter is placed between the sealing layer 106 and the front protective film 114 or on the side of a counter substrate (not shown). The white light generated in the OLED 6 is passed through the color filter, and thereby, e.g. red (R), green (G), blue (B) lights are generated.

In the circuit layer 74 of the display area 42, the above described pixel circuit 8, a scanning signal line 28, a picture signal line 30, a drive power supply line 32, etc. are formed. At least a part of the drive unit may be formed in an area adjacent to the display area 42 as the circuit layer 74 on the base material 70. As described above, the driver IC 48 forming the drive unit and the FPC 50 may be connected to a wire 116 of the circuit layer 74 in the component mounting area 46.

As shown in FIG. 3, a foundation layer 80 formed using an inorganic insulating material is placed on the base material 70. As the inorganic insulating material, e.g. silicon nitride ($SiN_y$), silicon oxide ($SiO_x$), and a complex thereof may be used.

In the display area 42, a semiconductor region 82 serving as a channel part and a source/drain part of a top-gate TFT 72 are formed via the foundation layer 80 on the base material 70. The semiconductor region 82 is formed using e.g. polysilicon (p-Si). For example, a semiconductor layer (p-Si film) is provided on the base material 70 and the semiconductor layer is patterned so that the portion used in the circuit layer 74 may be selectively left, and thereby, the semiconductor region 82 is formed.

A gate electrode 86 is placed via a gate insulating film 84 on the channel part of the TFT 72. The gate insulating film 84 is representatively formed using TEOS. The gate electrode 86 is formed by patterning of a metal film formed by sputtering or the like, for example. An interlayer insulating layer 88 is placed to cover the gate electrode 86 on the gate electrode 86. The interlayer insulating layer 88 is formed using e.g. the inorganic insulating material. In the semiconductor region 82 (p-Si) serving as the source/drain part of the TFT 72, an impurity is introduced by ion implantation, further, a source electrode 90a and a drain electrode 90b electrically connected thereto are formed, and thereby, the TFT 72 is formed.

An interlayer insulating film 92 is placed on the TFT 72. A wire 94 is placed on the surface of the interlayer insulating film 92. The wire 94 are formed by patterning of a metal film formed by sputtering or the like, for example. For example, the wire 116 and the scanning signal line 28, the picture signal line 30, and the drive power supply line 32 shown in FIG. 1 may be formed by a multilayer wiring structure using the metal film forming the wire 94 and the metal film used for formation of the gate electrode 86, the source electrode 90a and the drain electrode 90b. On the structure, a planarizing film 96 and a passivation film 98 are formed and, in the display area 42, the OLED 6 is formed on the passivation film 98. The planarizing film 96 is formed using e.g. a resin material. The passivation film 98 is formed using e.g. an inorganic insulating material such as $SiN_y$.

The OLED 6 includes a lower electrode 100, an organic material layer 102, and an upper electrode 104. Specifically, the organic material layer 102 includes a hole transport layer, a light emission layer, an electron transport layer, etc. The OLED 6 is representatively formed by stacking of the lower electrode 100, the organic material layer 102, and the upper electrode 104 from the base material 70 side in this order. In the embodiment, the lower electrode 100 serves as the anode of the OLED 6 and the upper electrode 104 serves as the cathode thereof.

If the TFT 72 shown in FIG. 3 is the drive TFT 12 having a n-channel, the lower electrode 100 is connected to the source electrode 90a of the TFT 72. Specifically, after the formation of the above described planarizing film 96, a contact hole 110 for connection of the lower electrode 100 to the TFT 72 is formed, and the lower electrode 100 connected to the TFT 72 is formed for the respective pixels by patterning of the conducting part formed on the surface of the planarizing film 96 and inside the contact hole 110, for example. The lower electrode is formed using e.g. a transmissive conducting material including ITO (Indium Tin Oxide) and IZO (Indium Zinc Oxide), a metal including Ag and Al.

On the structure, a rib 112 for separating the pixels are placed. For example, after the formation of the lower electrode 100, the rib 112 is formed in the boundary between the pixels, and the organic material layer 102 and the upper electrode 104 are stacked in the effective region (the region in which the lower electrode 100 is exposed) of the pixel surrounded by the rib 112. The upper electrode 104 is formed using e.g. an ultrathin alloy of Mg and Ag and a transmissive conducting material including ITO and IZO.

On the upper electrode 104, the sealing layer 106 is placed to cover the whole display area 42. The sealing layer 106 has a stacking structure including a first sealing film 161, a sealing planarization film 160, and a second sealing film 162 in this order. The first sealing film 161 and the second sealing film 162 are formed using an inorganic material (e.g. inorganic insulating material). Specifically, the film is formed by deposition of a $SiN_y$ film using chemical vapor deposition (CVD). The sealing planarization film 160 is formed using an organic material (e.g. a resin material including a curable resin composition). On the other hand, the sealing layer 106 is not placed in the component mounting area 46.

For example, for securement of mechanical strength, a protective film is stacked on the surface of the display panel 40. Specifically, the front protective film 114 is bonded to the surfaces of the display area 42 and a frame area 44 surrounding the display area 42 using a pressure-sensitive adhesive (not shown). The front protective film 114 is formed using e.g. a resin film such as a polyethylene terephthalate (PET) film, and has a thickness of e.g. about 120 μm. On the other hand, in the component mounting area 46, no front protective film 114 is provided for facilitating the connection of the driver IC 48 and the FPC 50. The wire of the FPC 50 and the terminal of the driver IC 48 are electrically connected to the wire 116, for example. Representatively, the driver IC 48 and the FPC 50 are joined to the base material 70 using an adhesive material (specifically, an adhesive material containing an anisotropic conducting material).

Figure 4:
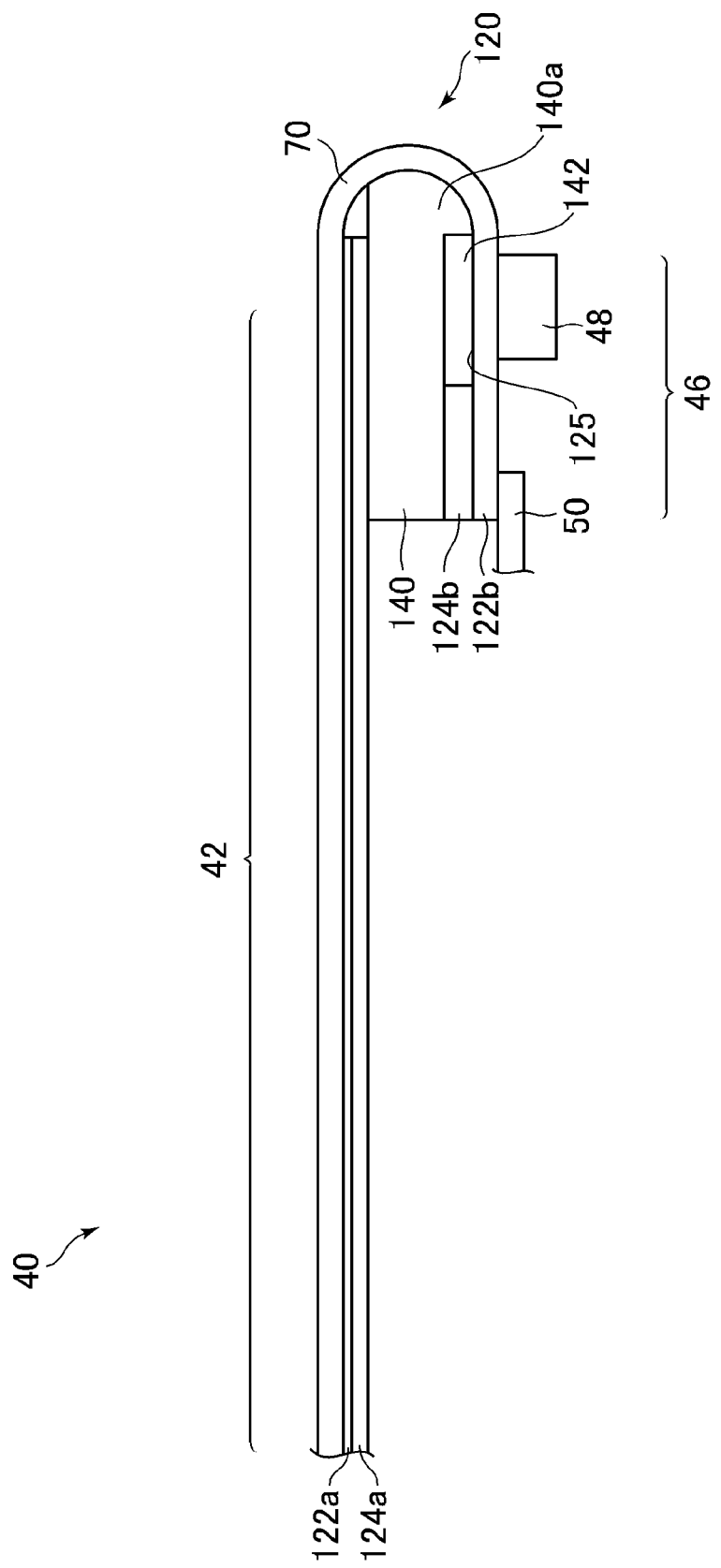
FIG. 4 shows an example in which one end of the display panel shown in FIG. 2 is bended.

FIG. 4 shows an example in which one end of the display panel shown in FIG. 2 is bended in a section along III-III. As shown in FIG. 3, the display panel 40 may be manufactured with the base material 70 held flat, however, for example, when the panel is housed in the housing of the organic EL display device 2, as shown in FIG. 4, a bending area 120 is provided outside of the display area 42, and the component mounting area 46 is placed on the back side of the display area 42. In this case, preferably, the back protective film 124 is stacked in the area except the bending area 120 (respectively on both sides of the bending area 120). Specifically, a first back protective film 124a is stacked in the display area 42 and the frame area 44 of the base material 70 via an adhesion layer 122a and a second back protective film 124b is stacked in the component mounting area 46 of the base material 70 via an adhesion layer 122b, and the back side of the base material 70 is exposed in the bending area 120. Note that, in FIG. 4, of the stacking structure of the display panel 40 shown in FIG. 3, the stacking structure on the base material 70 is omitted.

As the back protective film 124, any suitable resin film may be used. The resin film includes e.g. a PET film and a polyimide film. The thickness of the resin film is e.g. from 30 μm to 150 μm. An adhesion layer 122 used for stacking of the back protective film 124 may be formed using any suitable material. For example, a pressure-sensitive adhesive (representatively, acrylic-based adhesive) is used. In this case, the thickness of the adhesion layer (pressure-sensitive adhesive layer) 122 is e.g. from 10 μm to 30 μm. Generally, an adhesive film with a pressure-sensitive adhesive layer formed in advance on a resin film is used.

In FIG. 2, the area in which the back protective film 124 (124a, 124b) is placed shown by broken lines, and, in the component mounting area 46, the second back protective film 124b is stacked in the area except the area in which the driver IC 48 of the base material 70 is provided. Specifically, the second back protective film 124b is formed in a C-shape opening toward the area in which the driver IC 48 is provided. Accordingly, an exposed portion 125 in which no back protective film 124 is stacked is formed at least in the area with the driver IC 48 provided therein in the back side of the base material 70.

For example, while the base material 70 is held flat, the surface of the first back protective film 124a and the surface of the second back protective film 124b are set in the same plane. This is because, for example, in the manufacturing process, defects due to the level difference between the surface of the first back protective film 124a and the surface of the second back protective film 124b may be prevented. In the embodiment, the first back protective film 124a and the second back protective film 124b are separate members, however, for example, a single back protective film 124 having an opening portion at least in the area in which the driver IC 48 is provided (substantially, the mounting area of the driver IC 48 and the area surrounding the mounting area) may be used.

The formation of the circuit layer 74 including the TFT 72, the OLED 6, the sealing layer 106, etc. is generally performed on the base material 70 supported by a support substrate (e.g. glass substrate) in view of handling ability or the like. In this case, after the support substrate is separated from the base material 70, the back protective film 124 is provided on the base material 70.

In the embodiment, as shown in FIG. 4, a bending spacer 140 is placed between the first back protective film 124a and the second back protective film 124b, and the display panel 40 is curved with predetermined curvature so that the base material 70 may be along an end 104a of the bending spacer 140. In the illustrated example, in the area in which the driver IC 48 is provided, an air gap exists between the base material 70 and the spacer 140, however, for example, a space 142 formed by the base material 70 and the spacer 140 may be filled and reinforced with a resin material or the like (specifically, a material different from the material forming the adhesion layer 122 and the back protective film 124).

FIG. 5 is a schematic diagram showing mounting of the driver IC 48 on the base material 70. In FIG. 5, only a part of the frame area 44, the bending area 120, and the component mounting area 46 in FIG. 3 are shown, and, of the stacking structure of the display panel 40 shown in FIG. 3, the stacking structure on the base material 70 is omitted.

The driver IC 48 is placed in a predetermined position of the component mounting area 46 of the base material 70 with the back protective film 124 provided thereon via an adhesive material (not shown). As the adhesive material, representatively, a thermosetting adhesive composition containing an anisotropic conducting material is employed. Accordingly, the base material 70 with the driver IC placed thereon is placed between an upper head 210 and a lower head 220 having a heating and pressurizing mechanism as shown in the drawing. The lower head 220 has a contact portion 220a slightly larger than the outer circumferential shape of the driver IC 48, and the contact portion 220a of the lower head 220 is housed within the exposed portion 125 of the base material 70. Specifically, the contact portion 220a of the lower head 220 is placed in direct contact with the base material 70.

Then, the driver IC 48 and the base material 70 are heated and pressurized using the upper head 210 and the lower head 220. Here, the adhesive material may be heated and cured by heating. In the above described manner, the driver IC 48 is mounted. According to the embodiment, no pressure-sensitive adhesive layer 122 is sandwiched between the pair of heads, and the pressure of the heads may be efficiently used for mounting of the driver IC 48. Specifically, stress relaxation by the pressure-sensitive adhesive layer 122 may be excluded. As a result, the mounting failure of the driver IC may be suppressed, and that contributes to improvements in yield and connection reliability. One of the features of the invention is that the mounting failure of the components may be suppressed without using the support substrate.

The invention is not limited to the above described embodiment, but various changes can be made. For example, the configuration shown in the above described embodiment may be replaced by a configuration having substantially the same configuration and the same function or a configuration that may achieve the same purpose.

It will be understood that a person skilled in the art may conceive various modified examples and altered examples within the spirit of the invention and those modified examples and altered examples fall within the scope of the invention. For example, the above described respective embodiments with addition or deletion of component elements or design changes, or addition or omission of steps or condition changes by a person skilled in the art as appropriate fall within the scope of the invention as long as the subject matter of the invention is provided.

What is claimed is:

1. A method of manufacturing a display device comprising:
    placing a component via an adhesive material on one side of a base material containing a resin, wherein a display area including a plurality of pixels is formed on the one side of the base material;
    stacking a protective film via a pressure-sensitive adhesive layer on the other side of the base material; and
    mounting the component on the base material by sandwiching and pressurizing the base material and the component using a pair of heads,
    wherein an exposed portion in which no protective film is stacked is formed on the other side of the base material and is provided in correspondence with at least an area in which the component is provided on the one side of the base material, and
    one of the pair of heads has a contact portion, and, at the mounting, the contact portion is housed within the exposed portion of the base material and the contact portion is brought into direct contact with the base material.

2. The method according to claim 1, wherein the component is a driver IC.

3. The method according to claim 1, wherein a thickness of the pressure-sensitive adhesive layer is from 10 μm to 30 μm.

4. The method according to claim 1, wherein the adhesive material is heated at the pressurization.

5. A display device comprising:
    a base material containing a resin and having a display area including a plurality of pixels and a component mounting area;
    an IC component provided in the component mounting area of the base material via an adhesive material;
    a flexible printed board provided in the component mounting area of the base material; and
    a protective film stacked via a pressure-sensitive adhesive layer on an opposite side to a side of the base material on which the component is provided,
    wherein an exposed portion in which no protective film is stacked is formed on an opposite side to a side of the display area,
    wherein in a plan view, the exposed portion overlaps the IC component and the component mounting area, and
    wherein in the plan view, the protective film overlaps the flexible printed board and the component mounting area.

6. The display device according to claim 5, further comprising a spacer, wherein
    the base material has a bending area between the display area and the component mounting area along the base material in a cross sectional view,
    the display area, the spacer, the protective film and the exposed portion, and the IC component and the flexible printed board, are arranged in this order in the cross sectional view in a width direction of the base material, and
    the bending area, the exposed portion, the IC component, the protective film, and the flexible printed board are arranged in this order in the cross sectional view in a direction perpendicular to the width direction of the base material.

7. The display device according to claim 5, wherein a thickness of the pressure-sensitive adhesive layer is from 10 μm to 30 μm.

8. The display device according to claim 5, wherein the pressure-sensitive adhesive layer is formed using an acrylic-based pressure-sensitive adhesive.

9. The display device according to claim 5, wherein the protective film is a PET film.

10. The display device according to claim 5, wherein the base material has a bending area and the exposed portion of the base material includes at least a part of the bending area.

* * * * *